United States Patent [19]

Baur et al.

[11] 4,430,641

[45] Feb. 7, 1984

[54] CHARGE-PUMP GLITCH FILTER

[75] Inventors: Bruce K. Baur, Milwaukie; John R. Ollis, Canby, both of Oreg.

[73] Assignee: Tektronix, Inc., Beaverton, Oreg.

[21] Appl. No.: 262,718

[22] Filed: May 11, 1981

[51] Int. Cl.³ .................. H03K 13/02; H03K 5/08; H03H 11/12; H04B 15/00

[52] U.S. Cl. .................. 340/347 DA; 340/347 M; 328/128; 328/165; 307/543; 307/555; 364/825

[58] Field of Search ............. 364/718, 721, 825, 607, 364/608; 328/14, 128, 167, 165; 307/227, 542, 555, 491, 503, 540, 543, 545, 551, 520; 330/260, 302; 340/347 DA, 347 M

[56] References Cited

U.S. PATENT DOCUMENTS

| | | | |
|---|---|---|---|
| 3,628,061 | 12/1971 | Jackman | 328/186 |
| 3,676,698 | 7/1972 | Hunter | 328/128 |
| 3,676,784 | 7/1972 | Le Compte | 328/186 |
| 3,755,750 | 8/1973 | Heberling | 307/503 |
| 3,893,036 | 7/1975 | Cavoretto et al. | 307/227 |
| 3,912,916 | 10/1975 | Grün et al. | 328/167 |
| 3,918,046 | 11/1975 | Rivers | 307/227 |
| 3,919,649 | 11/1975 | Logemann | 307/227 |
| 4,016,559 | 4/1977 | Pastoriza | 307/543 |
| 4,101,839 | 7/1978 | Poole et al. | 328/165 |
| 4,132,908 | 2/1979 | Hughes | 328/165 |
| 4,163,948 | 8/1979 | Rieger et al. | 330/302 |
| 4,204,170 | 5/1980 | Kage | 307/551 |
| 4,275,453 | 6/1981 | Wagner | 328/167 |

Primary Examiner—Jerry Smith
Assistant Examiner—William G. Niessen
Attorney, Agent, or Firm—Thomas J. Spence

[57] ABSTRACT

A circuit including a conventional digital-to-analog converter (DAC) and a charge pump for producing an analog representation of an input waveform defined by an input digital bit stream, the analog representation being relatively free of spurious aberrations usually present in the output of a conventional DAC. The charge pump and an associated integrator are used to produce a first approximation of the input waveform and the DAC and an associated detuned slew-rate filter are used to maintain the first approximation in long-term conformance with a more accurate second approximation. Spurious aberrations in the second approximation are integrated over several steps of the input bit stream, thereby minimizing their adverse impact on the relatively true first approximation.

10 Claims, 7 Drawing Figures

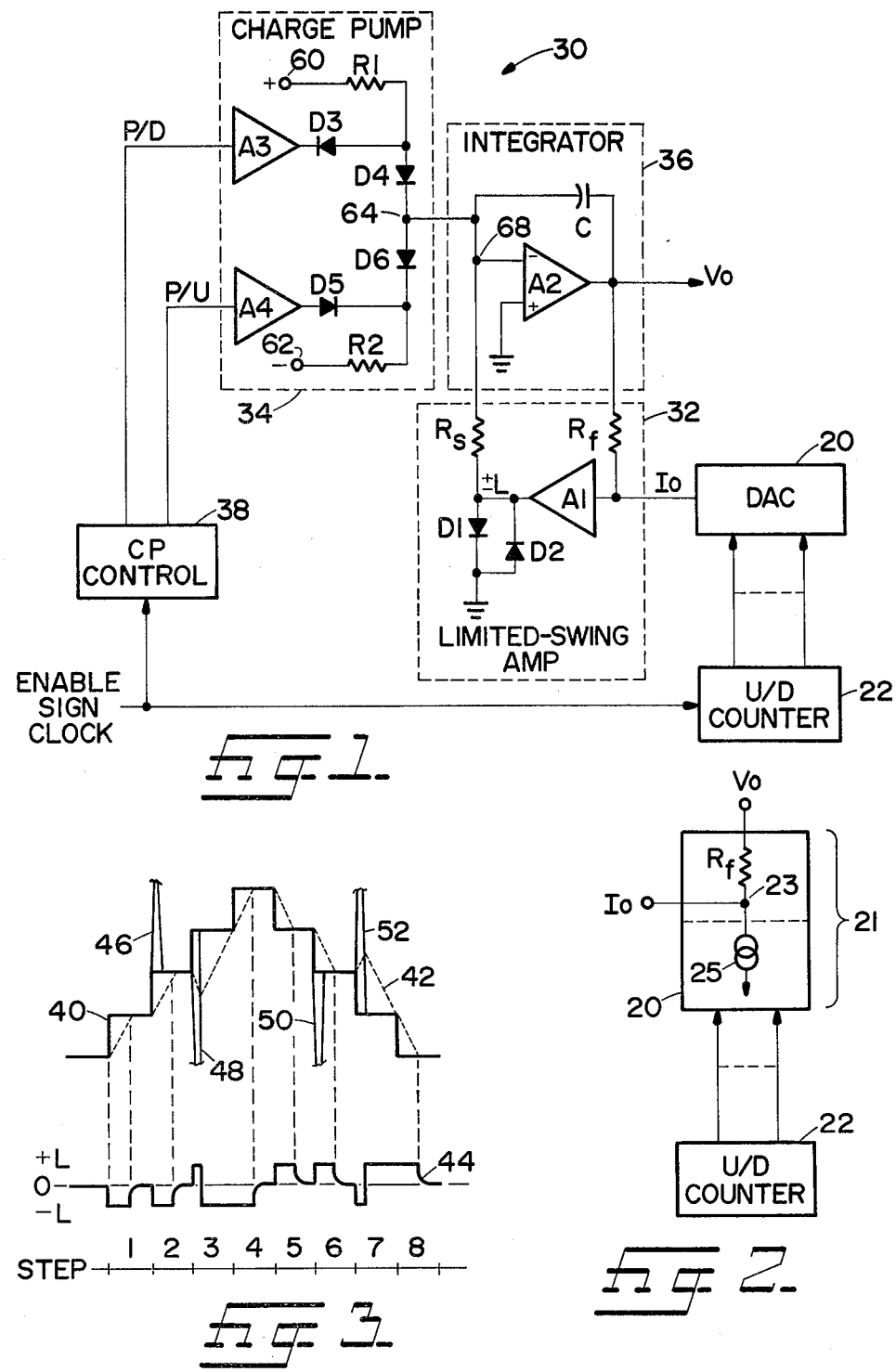

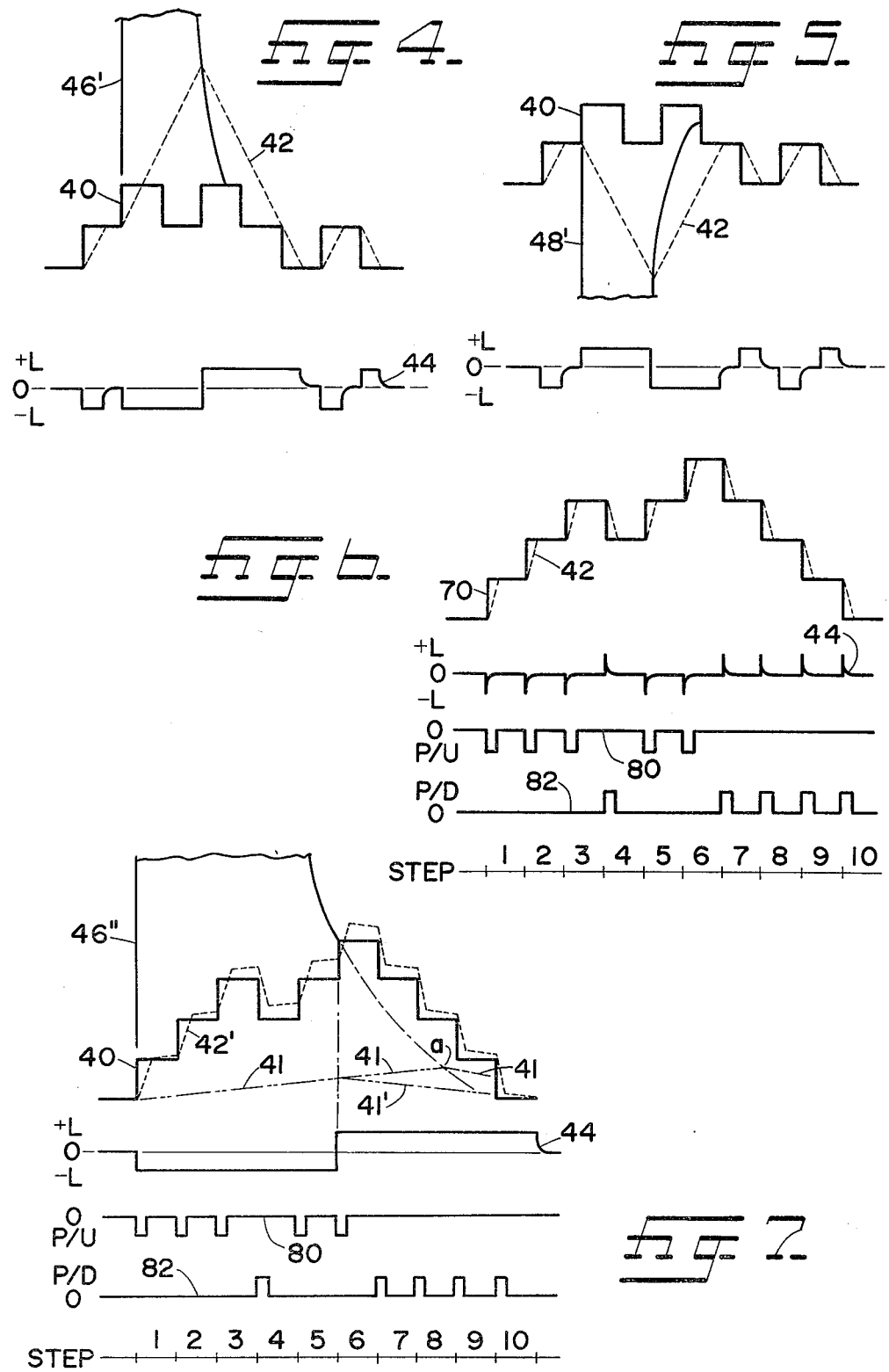

CHARGE-PUMP GLITCH FILTER

BACKGROUND OF THE INVENTION

The subject matter of the present invention pertains to means for minimizing the effect of undesirable excusions or aberrations within the output of a digital-to-analog converter.

As is known to the art, digital-to-analog converters (DAC's) are usually formed in sections, with each section being controlled by a preselected subset of the bits within an input digital signal. For example, a 12-bit DAC might be divided into four sections, each of which is controlled by three bits of the input signal. As the input changes, the output of each affected section changes; the output of the DAC being the composite sum of the outputs from each section. Ideally, the output of the DAC is a series of analog step functions, the magnitudes and directions of which are a function of the changes in the digital input.

As is also known to the art, significant excursions (spikes, glitches) occur in the output signal in response to certain changes in the input. These excursions—the result of delays inherent in the DAC circuitry, out-of-synch switching of internal current sources, and other known causes—are especially prevalent at points of major transition; a major transition being a change in the input signal causing the DAC to switch from one internal section to another. In the example cited above, assuming a linear relationship between the input bits and the DAC sections, a major transition would occur when the input signal changes from $0111_2$ to $1000_2$ (first section deactivated, second section activated) or in the opposite direction from $001000_2$ to $000111_2$ (second section deactivated, first section activated) or between any two values causing a particular DAC section to be deactivated at the same time another section is activated. In the more general case, where each input bit controls a single one-bit section, a worst-case major tansition occurs when one bit is changed in one direction at the same time that all remaining bits are changed in the other direction; for example, when the input switches from $01111111_2$ to $10000000_2$. The effect is less when less bits are switched. In either case, although the excursions thus produced are of fairly short duration—on the order of several hundred nanoseconds, or less—they may still extend over several cycles of a faster changing input. In a graphics display environment wherein DAC's are used, for example, to drive callidgraphically an electron beam in a cathode-ray tube, such excursions are observable as nonlinearities in beam movement and non-uniformities in beam intensity.

Known attempts to remove or minimize undesirable excursions in DAC outputs include the use of both linear filtering and sample-and-hold techniques. Although linear filtering reduces the amplitude of the excursion—by integration over a longer period of time—it does not reduce the excursion energy. Sample-and-hold techniques, while satisfactory at low input rates, are difficult to realize at very high rates and often produce their own component of noise and signal excursions.

Another known attempt to solve the problem of unacceptable excursions in a DAC output is the non-linear filter disclosed in Rieger et al. U.S. Pat. No. 4,163,948 assigned to Tektronix, Inc., the assignee of the present invention. Using slew-rate techniques, the Rieger et al. filter removes all of some excursions and parts of others; however, it is less capable of handling adequately excursions extending over more than one change of the input signal.

SUMMARY OF THE INVENTION

The present invention is directed to a circuit and method of same combining the advantages of an aberration-free charge pump and a slew-rate filter to convert an input digital signal into an accurate analog representation. More particularly, the circuit of the present invention comprises a limited-swing amplifier and a charge pump combined to form a common entity via a shared integrator. The input to the amplifier is from a current-output digital-to-analog converter (DAC) and the input to the charge pump is from a source of pump-up/pump-down signals synchronized with the input of the DAC.

The amplifier and integrator define a slew-rate filter, while the charge pump and integrator define an open-loop digital-to-analog converter, the latter combination being sometimes referred to informally as a "bucket and ladle." Driving the charge pump and integrator with a series of unit-step pump-up/pump-down signals, and an associated clock signal, produces an excursion-free analog output that is representative of the accumulated unit changes, but which is still susceptible to open-loop drifting. Driving the amplifier and integrator with the output from a conventional DAC produces an output that is an accurate slew-rate limited version of the digital input, but which is also susceptible to degradation by long-term excursions. (As referred to herein, a short-term excursion is an excursion of duration sufficiently short to be eliminated within a unit step time by conventional slew-rate techniques. A long-term excursion is an excursion of longer duration.)

By combining the two fructions via the shared integrator, and decreasing the slew rate so as to capture the long-term excursions, a circuit is produced that is capable of providing an output that is substantially free of short-term excursions and relatively unaffected by long-term excursions. The result, in effect, is a change-pump driven integrator in feedback relationship with a slew-rate limited DAC. Unit changes in the output are a function of current pulses produced by the charge pump and integrated by the integrator, while long-term accuracy is a function of a constant comparison between the integrated charge pump pulses and the slew-rate limited output of the DAC. The result is an open-loop first approximation of the input signal, produced by the charge pump, that is continually caused to follow a more accurate second approximation produced by the DAC. Neither the charge-pump driven integrator, or the slew-rate filter and DAC, acting alone, is capable of providing the accuracy and fidelity of their unique combination.

The circuit of the present invention is especially useful in those applications where DAC's are operated to produce quasi-continuous waveforms; i.e., where the DAC input changes in unit steps at a very high rate. An example of such an application is the digital vector generation function within a graphics display system.

It is, therefore, a principal objective of the present invention to provide a circuit including a DAC for producing an analog output that is free of undesirable short-term excursions and relatively unaffected by undesirable long-term excursions.

It is an additional principal objective of the present invention to provide a circuit for use with a DAC to minimize the effect of long-term excursions in the DAC output.

It is a further principal objective of the present invention to provide a circuit employing charge-pump integration and slew-rate filtering to produce an accurate digital-to-analog conversion.

The foregoing objectives, features, and advantages of the present invention will be more readily understood upon consideration of the following detailed description of the invention taken in conjunction with the accompanying drawings.

BRIEF DESCRIPTION OF THE DRAWINGS

FIG. 1 is a simplified schematic representation of the circuit of the present invention.

FIG. 2 is a simplified schematic representation of a DAC and digital counter for use with the circuit of FIG. 1.

FIGS. 3-6 are signal charts showing certain signals produced during the segmented operation of certain portions of the circuit of FIG. 1.

FIG. 7 is a signal chart showing certain signals produced during the operation of the entire circuit of FIG. 1.

DETAILED DESCRIPTION OF THE PREFERRED EMBODIMENT

Referring first to FIG. 1, there is shown in simplified schematic representation an exemplary embodiment of the charge-pump glitch filter of the present invention together with a current-output digital-to-analog converter (DAC) 20 and an up/down counter 22. (The term "glitch", although somewhat informal, is well recognized within the industry and is used herein in its general sense to describe a spike, excursion, or other momentary aberration, usually undesirable, in an analog or digital signal.) As disclosed, the glitch filter of FIG. 1, comprises a limited-swing amplifier 32, a charge-pump 34, an integrator 36, and a charge-pump control circuit 38. Input to the filter includes the output of the DAC 20 together with the same enable and sign signals, i.e., up one or down one, and clock signal, or their equivalent, used to operate the counter 22 driving the DAC. the output of the filter, $V_o$ is at all times an analog representation of the digital value currently stored in the counter 22 (the algebraic sum of all the up-one's and down-one's). In a digital vector generator environment, the output $V_o$ represents the current position, in one dimension, of a vector-generated point. For a two-dimensional vector display, a separate filter and DAC would be employed for each of the horizontal and vertical vector inputs.

The various sections of the glitch filter of FIG. 1 may be realized in any suitable form known to the art. For example, the limited-swing amplifier 32 and integrator 36, which define in combination a slew-rate filter similar to that disclosed in the earlier cited Reiger et al. U.S. Pat. No. 4,163,948, may include in simplified form an amplifier A1, the output of which is clamped within predefined limits $\pm L$ by diodes D1 and D2; a slew-rate resistance $R_s$; a second amplifier A2 and integrating capacitance C; and a feedback resistance $R_f$. Amplifier A1 and the two diodes D1 and D2 are, of course, symbolic; actual realization might include, for example, a series of ECL line receivers configurated as linear amplifiers operating between preset limits (not saturation).

The charge-pump 34, similarly simplified, may include a pump-down amplifier A3 and a pump-up amplifier A4 coupled to the slew-rate filter via the diode/resistor network comprising diodes D1 through D4 and resistors R1 and R2.

As suggested in FIG. 2, the current-output DAC 20 may be realized as the current-source portion of a conventional voltage-output DAC 21. By tapping the DAC 21 at the summing node 23 between the source 25 and the feedback resistance $R_f$, a current output $I_o$ is obtained that is proportional to the more familiar voltage output $V_o$. For ease of visualization, the feedback resistance $R_f$ is shown in FIG. 1 as part of the limited-swing amplifier 32.

Operation of the circuit of FIG. 1 is best understood after a brief discussion of the segment defined by the limited-swing amplifier 32 and the integrator 36. Ignoring for the moment the charge-pump 34 and its associated control circuit 38, the amplifier 32 and integrator 36, as indicated earlier, define in concept a slew-rate filter known to the art for its ability to minimize certain short-term aberrations in the output of a conventional DAC. The slew rate is determined primarily by the values of the resistance $R_s$ and the capacitance C. Normally, the value of $R_s$ is chosen to produce a slew rate approximately twice the input step rate. This permits the output $V_o$ to settle at the desired step level before receipt of the next step input.

An example of slew-rate filter operation is shown in FIG. 3 wherein the upper curve represents a somewhat glitchy incrementing-then-decrementing DAC output signal 40 (solid line) and its slew-rate limited counterpart 42 (dashed lline), and the lower curve represents the clamped output 44 of the limited-swing amplifier A1. The $\pm L$ located adjacent the lower curve indicates the swing limits. Each step of the DAC signal 40 represents a change in the least significant bit (LSB) of the value stored or accumulated in the counter 22 and the truncated spikes 46-52 represent the glitches. For ease of reference, the DAC steps are numbered 1 through 8 along the bottom of the figure.

The overall effect of the slew-rate filter is to convert the vertical leading edge of each DAC step into a ramp having a slope proportional to the slew rate. In the example of FIG. 3, the slew rate is assumed to be twice the DAC step rate. Note that, for glitch-free steps 1, 4, 5, and 8, and for those steps 2 and 6 where the glitches 46 and 50 are in the same direction as the step, the result is a general smoothing of the input waveform into a series of similarly directed ramp functions. For those steps 3 and 7, however, where the glitches 48 and 52 are in the opposite direction as the step, the output signal 42 follows first the glitch and then the step. Thus, not only does slew-rate filtering degrade the input step functions into relatively long-slope ramp functions, but it also permits an adverse response to opposite-going glitches.

The deficiencies indicated are especially pronounced when the glitch extends over several changes in input step signal, as suggested by FIGS. 4 and 5. Note that a glitch 46' or 48' of sufficient duration in either direction can result in the loss or distortion of several steps of input information. In the field of information display, for example, where input step widths may be on the order of 160 nanoseconds, it is not uncommon to encounter DAC glitches lasting on the order of 600 nanoseconds.

Returning to FIG. 1, consider now the segment defined by the charge-pump 34, its associated control circuit 38, and the integrator 36. The charge pump 34 is essentially a current source capable of pumping current into and out of the integrator 36 in response to signals received from the control circuit 38. The two diodes D4 and D6 act as current switches to direct the current in the direction desired. The values of the two resistors R1 and R2 are chosen so that, with the system at rest, and with equal but opposite potentials applied to the two terminals 60 and 62, the terminal 64 between the two diodes D4 and D6 represents a virtual ground and the output $V_o$ from the integrator 36 represents the accumulated charge on the capacitance C. To change the output $V_o$, it is only necessary to change the level of capacitance charge. To change the level of capacitance charge, it is only necessary to pump current into or out of the integrator 36. Thus, the charge pump and integrator combination defines somewhat an open-loop digital-to-analog converter (as long as the input changes are limited to unit steps).

The control circuit 38 receives the same enable, sign, and clock signals, or their equivalent, as does the counter 22 mentioned earlier. In response to a positive set of signals, the control circuit issues a pump-down (P/D) signal to the charge pump 34; in response to a negative set of signals, it issues a pump-hup (P/U) signal. At rest, the output of amplifier A3 is low with respect to ground, and the output of the amplifier A4 is high. Under these conditions, current will flow through resistor R1 and diode D3 and into amplifier A3, and through diode D5 and resistor R2 and out of amplifier A4.

If the output of amplifier A3 is forced high, the current that was previously flowing through the diode D3 will be pumped into the summing node 68 of the integrator 36 via diode D4, thereby changing in the negative direction the charge on the capacitance C; hence, "pump-down". If, on the other hand, the output of the amplifier A4 is forced low, the terminal 64 will be lowered below ground, and current will be pumped out of the integrator via diode D6, thereby changing in the positive direction the charge on the capacitance C; hence, "pump-up". Thus, by supplying the appropriate series of pump-up and pump-down signals to the charge pump 34, the output $V_o$ can be made to follow the input digital waveform defined by the input enable, sign, and clock signals (still assuming unit steps).

An example of the operation of the charge pump and integrator segment just described is shown in FIG. 6 wherein the curve 70 (solid line) represents the desired output waveform and the curve 42 (dashed line) represents, as before, the output $V_o$ actually produced. (Ignore for now the curve labeled 44.) As is the convention, the input signal assumed to be received is a series of enable, sign, and clock signals, or their equivalent, defining the presence, direction, and timing, respectively, of each input step. In theory, the enable and sign signals represent an input bit stream defining a digital waveform. The clock signal ensures synchronization of the circuit of FIG. 1 with the remainder of the system of which it forms a part. The pump-up and pump-down signals produced by the control circuit 38 in response to the input bit stream are shown in FIG. 6 as 80 and 82, respectively. For each positive or incremental step 1, 2, 3, 5, 6, the control circuit 38 produces a pump-up signal; for each negative or decrementing step 4, 7-10, the circuit produces a pump-down signal. The magnitude and duration of each pump-up and pump-down signal is chosen to produce the desired output step. In the example of the figure, the pulse duraton is about one quarter that of an LSB step.

Operation of the charge pump and integrator combination causes, in effect, the pump-up and pump-down pulses to be integrated into ramp functions defining the output signal 42. Note that this signal is inherently glitch free. It is also quite similar to the signal produced by the slew-rate filter described earlier (see FIG. 3), except that the slopes of the inclined leading edges are steeper. (If the slopes of the slew-rate signal were similarly steepened, the output signal 42 of FIG. 3 would contain even more of the opposite-going glitches.) A problem with such a charge-pump/integrator approach, taken alone, is that, absent some kind of feedback correction, the output 42 will tend to drift over time from a true representation of the input.

Consider now, the circuit of FIG. 1 in its entirety; that is, with the charge pump 34 and limited swing amplifier 32 combined via the integrator 36. Consider also that the value of the resistance $R_s$ is increased to produce a slew-rate substantially less than (for example, about one tenth) the anticipated input bit rate. The result, in effect, is a charge-pump driven integrator, the output of which is in feedback relationship with the output of the DAC 20.

Operation of the circuit of FIG. 1 is best understood with continued initial reference to the signal chart of FIG. 6 wherein curve 70 now represents the output of the DAC 20 and curve 44, ignored earlier, represents the clamped output of the limited-swing amplifier A1. Curve 42 continues to represent the circuit output $V_o$. As the charge-pump control circuit 38 and the counter 22 each receive the same set of input signals, the charge pump 34 and the DAC 20 are activated or stimulated in unison. That is, each time the counter 22 is incremented, the charge-pump control circuit 38 issues a pump/down signal, and each time the counter is decremented, the control circuit issues a pump/up signal. Consequently, an imbalance is impressed across the integrator 36 only during the time that the charge-pump pulse 80 and 82 are being integrated to a level matching that of the DAC output 70. With each imbalance, amplifier A1 is activated to produce a clamped output 44 of a polarity attempting to correct the imbalance.

Absent the presence of long-term glitches in the DAC output 70, and absent drift-caused differences between the DAC output and that produced by operation of the charge pump 34, operation of the circuit of FIG. 1 continues essentially as just described. Even if short-term glitches are present in the DAC output, the decreased slew-rate produced by the value of the resistance $R_s$ will cause those glitches to be almost completely eliminated. Should the charge-pump produced output begin to depart significantly from that of the DAC 20, amplifier A1 will produce the appropriate correction signal and bring the two outputs back to coincidence.

The primary advantage of combining the features of a charge-pump driven integrator and slew-rate filter as disclosed in the circuit of FIG. 1 is the manner in which long-term glitches in the DAC output signal may be spread over several cycles of the input signal with minimal degrading impact. Referring now to FIG. 7, such a glitch 46" is assumed to occur at the beginning of step 1 and last until about the beginning of step 10. At the start of the glitch 46", a significant imbalance is impressed across the integrator 36, and the amplifier A1 is driven to its negative limit −L as indicated by the curve 44.

(Remember: without the glitch 46'', the imbalance produced by input step 1 would be offset by the pulse from the charge-pump 34 and the amplifier A1 would be activated only until the pulse has been integrated to the level of the DAC output. Compare with FIG. 6.) As long as the magnitude of the glitch 46'' (i.e., the output of the DAC 20) is greater than the magnitude of the accumulated charge-pump pulses, the amplifier A1 will remain at its $-L$ level. If the next input step should be negative, followed by no change, the effect of the glitch 46'' would be to cause the integrator output $V_o$ to rise slowly, as indicated by the dashed line 41 of FIG. 7, until reaching, at point a, the level of the now-decreasing glitch. At that point, the output 44 of the amplifier A1 switches to its positive limit $+L$ and the integrator output $V_o$ begins to fall equally slowly toward its initial level.

However, given the same input signal stream as assumed in FIG. 6, the effect is to superimpose the glitch-produced signal 41 onto the charge-pump produced signal 42 to produce the slightly skewed output signal 42'. Note that, in the example of FIG. 7, the integrator output signal 42' reaches the glitch magnitude at about the beginning of input step 6, and the amplifier A1 switches at that point to its positive limit $+L$. When the integrator output 41 and the DAC output 40 again reach coincidence, at about the end of input step 10, the amplifier A1 returns to its deactive or neutral state.

Thus it is seen that the unique combination of charge-pump integration and slew-rate filtering, embodied in the filter of the present invention, not only reduces the degradation inherent in the use of slew-rate filtering alone but it also reduces significantly the distortion usually caused by long-term aberrations in the output signal of a conventional DAC.

Although the input to the circuit of FIG. 1 has been assumed in the preceding discussion to define a continuous stream of unit-step charges, it will be recognized by those persons familiar with the art that the more general input is a disjointed combination of unit-step changes and gross or absolute position changes. A gross position change in a vector generation environment for example occurs most often at the start of a new vector or at a discontinuity in a current vector. To accommodate absolute position changes with the circuit of FIG. 1, it is necessary merely to short out the slew-rate resistance $R_s$ and load a new value into the up/down counter 22. Shorting the resistance $R_f$ is accomplished most readily by connecting a field-effect transistor (FET) across the resistance and then activating the FET each time a new value is loaded into the counter. Activating the FET and loading the counter may be accomplished via any suitable conventional means. Although the swing limit of the amplifier A1 is not affected by the change in feedback resistance, the current capability of the amplifier is increased, thereby permitting the integrator capacitance C to be charged, or discharged, more rapidly. Once the capacitance C has accrued its new charge, and any transients have settled out, the FET may be deactivated and continuous operation resumed.

The terms and expressions which have been used in the foregoing specification are used therein as terms of description and not of limitation, and there is no intention, in the use of such expression, of excluding equivalents of the features shown and described or portions thereof, it being recognized that the scope of the invention is defined and limited only by the claims which follow.

We claim as our invention:

1. A circuit for converting a digital input signal defining a series of unit changes in a digital value into an analog output signal representative of said value, said unit changes occurring at a predetermined maximum rate, said circuit comprising:
   (a) means responsive to said digital input signal for producing a first analog signal having an analog value representative of said digital value, and for changing said analog value in proportion to each change in said digital value;
   (b) a slew-rate filter responsive to said first analog signal, and having a slew rate substantially less than the maximum rate of unit change in said digital value, for integrating each change in said analog value over several periods of said digital input signal and for producing a second analog signal representative of said integrating change;
   (c) means also responsive to said digital input signal for producing a third analog signal representative of the direction and timing of each change in said digital value; and
   (d) means within said slew-rate filter for impressing said third analog signal onto said second analog signal to produce an analog output signal representative of the instantaneous sum of the integrating changes in said analog value and the direction and timing of the unit changes in said digital value.

2. The circuit of claim 1 wherein said slew-rate filter includes a limited-swing amplifier interconnected with an integrator, said amplifier being responsive to said first analog signal and said integrator having a summing node, and wherein said means within said slew-rate filter for impressing said third analog signal onto said second analog signal includes means for supplying said third analog signal and the output of said amplifier to said summing node.

3. The circuit of claim 1 wherein said slew rate is approximately one tenth the maximum rate of said unit changes in said digital value.

4. The circuit of claim 1 wherein said means for producing said third analog signal includes charge pump control means responsive to said digital input signal for producing first and second pump signals representative respectively of a unit change in a first and second direction in said digital value, and charge pump means responsive to said first and second pump signals for producing an analog signal representative of the direction and timing of each such change.

5. The circuit of claim 4 wherein said first and second pump signals comprise first and second current pulses of predetermined magnitude and duration.

6. The circuit of claim 5 wherein said first current pulse is positive for a unit change in said first direction and said second current pulse is negative for a unit change in said second direction.

7. A circuit responsive to a digital input signal defining a series of unit changes in a digital value for filtering undesirable aberrations from an analog signal produced by a digital-to-analog converter also responsive to said digital input signal, said circuit comprising:
   (a) a slew-rate filter responsive to said analog signal produced by said digital-to-analog convertor, and having a slew-rate substantially less than the maximum rate of unit changes in said digital value, for integrating each change in said analog signal over several periods of said digital input signal, and for producing a second analog signal representative of said integrating change;

(b) means responsive to said digital input signal for producing a third analog signal representative of the direction and timing of each change in said digital value; and (c) means within said slew-rate filter for impressing said third analog signal onto said second analog signal to produce an analog output signal representative of the instantaneous sum of the integrating changes in said analog signal and the direction and timing of the unit changes in said digital value.

8. The circuit of claim 7 wherein said slew-rate filter includes a limited-swing amplifier interconnected with an integrator, said amplifier being responsive to said analog signal produced by said digital-to-analog convertor and said integrator having a summing node, and wherein said means within said slew-rate filter for impressing said third analog signal onto said second analog signal includes means for supplying said third analog signal and the output of said amplifier to said summing node.

9. The circuit of claim 7 wherein said means for producing said third analog signal includes charge pump control means responsive to said digital input signal for producing first and second pump signals representative respectively of a unit change in a first and second direction in said digital value, and charge pump means responsive to said first and second pump signals for producing an analog signal representative of the direction and timing of each such change.

10. The circuit of claim 7 wherein said slew rate is approximately one tenth the maximum rate of said unit changes in said digital value.

* * * * *